United States Patent
Andersen et al.

(10) Patent No.: US 6,751,582 B1
(45) Date of Patent: Jun. 15, 2004

(54) METHOD AND SYSTEM FOR ENHANCED DESIGN VALIDATION THROUGH TRACE TAILORING

(75) Inventors: Flemming Andersen, Austin, TX (US); Jason Raymond Baumgartner, Austin, TX (US); Steven Leonard Roberts, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/392,839

(22) Filed: Sep. 9, 1999

(51) Int. Cl.$^7$ ................................................ G06F 17/50
(52) U.S. Cl. .................. 703/14; 703/15; 703/2; 716/4
(58) Field of Search .............. 703/2, 13, 14, 703/15, 16, 28; 716/5, 4; 714/38, 45

(56) References Cited

U.S. PATENT DOCUMENTS

| | | | | | |
|---|---|---|---|---|---|
| 5,111,413 | A | * | 5/1992 | Lazansky et al. | 703/14 |
| 5,465,216 | A | * | 11/1995 | Rotem et al. | 716/5 |
| 5,680,332 | A | * | 10/1997 | Raimi et al. | 703/13 |
| 5,751,592 | A | * | 5/1998 | Takai et al. | 716/5 |
| 5,845,064 | A | * | 12/1998 | Huggins | 714/33 |
| 5,999,717 | A | * | 12/1999 | Kaufmann et al. | 703/2 |
| 6,031,983 | A | * | 2/2000 | Barrett | 703/2 |
| 6,049,662 | A | * | 4/2000 | Saha et al. | 703/16 |
| 6,061,511 | A | * | 5/2000 | Marantz et al. | 703/28 |
| 6,064,948 | A | * | 5/2000 | West et al. | 702/119 |
| 6,077,304 | A | * | 6/2000 | Kasuya | 703/14 |
| 6,209,120 | B1 | * | 3/2001 | Kurshan et al. | 716/5 |
| 6,285,914 | B1 | * | 9/2001 | Bae et al. | 700/121 |
| 6,321,186 | B1 | * | 11/2001 | Yuan et al. | 703/15 |
| 6,405,326 | B1 | * | 6/2002 | Azagury et al. | 714/38 |
| 6,484,134 | B1 | * | 11/2002 | Hoskote | 703/14 |

OTHER PUBLICATIONS

Burch et al., "Symbolic model checking for sequential circuit verification", IEEE transactions on computer aided design of Integrated circuits and systems, Apr. 1994.*
Moser et al., "A Graphical Environment for the Design of Concurrent Real–Time Systems", ACM Transactions on Software Engineering and Methodology, vol. 6, No. 1, Jan. 1997, pp. 31–79.
Kern et al., "Formal Verification in Hardware Design: A Survey", ACM Transactions on Design Automation of Electronic Systems, vol. 4, No. 2, Apr. 1999, pp. 123–193.
Formal Hardware Verification with BDDs: An Introduction; Hu, Alan J.; 1997; pp 677–682.

* cited by examiner

Primary Examiner—Kevin J. Teska
Assistant Examiner—Kandasamy Thangavelu
(74) Attorney, Agent, or Firm—Duke W. Yee; Robert M. Carwell; Lisa L. B. Yociss (57) ABSTRACT

A formal verification method and apparatus allowing a user, via a waveform-based graphical user interface, to modify the waveform displayed by a verification algorithm by highlighting specific values at specific cycles. The user may begin either from scratch or from an existing trace produced by the tool. After running the tool, the resultant waveform represents a trace that the user wishes to extract from the model using the verification tool. The annotations input by the user are translated to "cycle-specific invariants" to force the tool to produce a trace that satisfies the desired annotated waveform and to insure a much faster and more efficient query. The invariants are then passed to a verification algorithm, which outputs a trace satisfying these invariants. The user determines whether the trace is satisfactory and may add additional constraints to the waveform to derive a subsequent trace until the user is satisfied.

27 Claims, 4 Drawing Sheets

METHOD AND SYSTEM FOR ENHANCED DESIGN VALIDATION THROUGH TRACE TAILORING

BACKGROUND OF THE INVENTION

1. Technical Field

The present invention relates to an improved method for verifying designs and, in particular, to a method of formal verification which provides the user with a simple method of extracting the desired data.

2. Description of Related Art

Designers and inventors have long sought methods of confirming their designs without actually building the design in physical form and using trial and error. With the advent of computers, simulation has become and still is the most common hardware verification framework in use today. Simulation requires that a battery of tests be run through a model of the implementation of a particular design, trying out a number of possible input variations, and then checking to see that the model meets the specifications. Simulation consists of the application of an ordered sequence of input vectors to a particular model that is being tested.

Simulation is polynomial in complexity with respect to the model being tested. However, for complex designs, the amount of behavioral coverage obtainable through simulation decreases rapidly. As designs become more complex, simulation becomes very inefficient in verifying the design. Hence, simulation cannot be done exhaustively even for moderately large designs.

Recently, there has been increased interest in formal verification methods. In formal verification methods, mathematical reasoning frameworks are implemented which exhaustively cover the design behavior. The method consists of using formal proofs to verify that a design satisfies certain properties, which are sometimes referred to as formal specifications.

While the algorithms used in formal verification methods tend to be exponential in complexity with respect to the design size, the results in the hands of skilled users have proven its utility. Symbolic model checking is a type of formal verification and is now a common part of the design validation process. Model checking is a fully automated technique which verifies that a set of properties specified with temporal formulas will hold for a given design.

Figure 1:
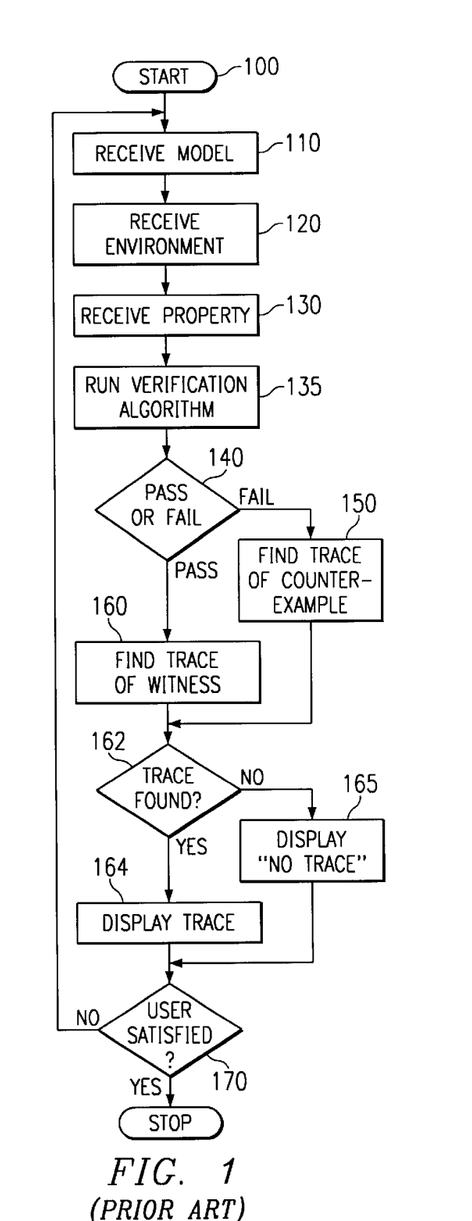
FIG. 1 is a flowchart of the model checking process in a typical prior art application.

Referring now to FIG. 1, algorithm 100 for such a technique requires a formal description of design environment 120. That is, a definition of the conditions to which the design under test is to be subjected must be provided to the algorithm. The algorithm also requires a description of the hardware itself, called the model 110, and a property 130 that is to be verified by algorithm 135. Once environment 120, model 110, and property 130 are input, a determination is made by algorithm 135 as to whether property 130 passes or fails at block 140.

In addition to a "pass or fail" result, a cycle-by-cycle trace of all signal values illustrating a counter-example is typically provided at block 150 upon a failure. A counter-example is a stream of execution which violates the specified property. Also, a trace illustrating a witness is typically provided at block 160 upon a pass. A witness is a stream of execution which non-trivially satisfies the specified property.

For example, if the property is "if REQ is active, then GNT must be active in 3 cycles," a nontrivial stream of execution which satisfies this property is one which shows that the request REQ becomes active. If so, then the grant GNT will be checked in three cycles, and if it is not active, then the property will fail. An example of a stream of execution which trivially satisfies the property is the case in which REQ never occurs. Thus, there will be no opportunity for the property to fail, and hence no meaningful trace to display.

In order to generate these traces, the model checker arbitrarily calculates a set of valuations of the state variables in the model which comprise only one possible witness or counter-example. If the user is happy with the trace that was generated by the model checker, then the model checking procedure is finished at block 170. However, if the user is not satisfied with the trace that was generated, either model 110 or environment 120 is modified in order to get a more satisfactory trace for property 130.

The complexity of model checking is also exponential in relation to the size of the model, the environment, and the property to be tested. The reason for this is that the modeling technique or tool performs a breadth-first exhaustive reachability calculation. That is, beginning with all initial states, all states reachable in one "simulation step"(denoted Image 1) are explored. Then, all states reachable in two simulation steps (denoted Image 2) are explored, and so on until no new states are found. One reason that breadth-first algorithms are typically used rather than depth-first algorithms is to avoid excessively long traces if the error could manifest itself in a shorter period of time using a breadth-first algorithm.

One shortcoming of formal verification techniques is the "state-space explosion." This problem is seen as the number of state variables in a model is increased. The number of states in a model with N state variables may equal $2^N$. Thus, as the number of state variables is increased, the complexity of the model increases exponentially. Therefore, such a formal verification method has limited application in industrial designs because of the complexity that usually exists in industrial designs.

Model checkers typically support the notion of the "invariant" or "invar" keyword, whose arguments are a set of Boolean properties. For example, using the command "invar p" truncates the state space exploration of the tool to only consider those states where "p" is true. All encountered states where p is not true are discarded along with their successors, generally. (Note that some of the successors will not be discarded if they are encountered along a different path where "p" is always true.) Because certain states and paths are ignored due to the invariants, the complexity of the model checking run is thereby reduced.

Imposing cycle-specific restrictions using traditional model checking tools requires the user to manually generate an automaton to count cycles and create standard invariants of the form "invar (automata=1)→(REQ=1)", "invar (automata=2)→(GNT=0)", etc. The use of an automaton in this manner creates additional state variables causing even more of a state-space explosion. The additional complexity of the extra automaton may outweigh the benefit of the use of such invariants. The verification tool in many cases consumes more CPU time/memory than in the original run where the automaton was not used. This manual and computational complexity is suffered merely to generate one tailored trace.

An automaton is a finite state machine (FSM). It is a state transition system that consists of a set of states, and a set of transitions defined from one state to the next. For example, consider the array <S, I, T> where S is the set of states, I is the set of inputs to the automaton, and T is the transition function. Intuitively, a Finite State Machine (FSM) or an automaton starts in an "initial state." From its present state, under control of the present input, T defines the next state to which the automaton will transition.

As noted earlier, formal verification (such as model checking) is roughly exponential in relation to the size of the model. Using the prior art, if a trace is obtained which is undesirable, the designer typically couples onto the model under test an automaton which does nothing more than count cycles. A set of user-defined cycle-specific invariants (as above) are then introduced to guide the state space search. This automaton initializes to count=0. Each transition increments its value by one. The implication is that with the automaton added, model checking becomes exponential in relation to the size of the model PLUS the size of the automaton. While the invariants prune the state space search, the constrained run is typically even more costly than the original unconstrained run due to the extra automaton.

Furthermore, because the trace selected by the tool is arbitrary, the problem of the case in which the selected trace is illegal, that is resulting from illegal input behavior, is encountered. To avoid these frequent illegal trace selections, the verification engineer must go to great lengths to specify the environment and property composition that forces the model checker to produce a different and hopefully more attractive trace. This frequently involves very complicated logic and reasoning which is often as complex as the model itself, and in many cases requires a larger composed model, environment, or property composition resulting in an even greater state-space explosion.

To solve this problem, multiple distinct environments are used. One small environment is used for normal "fast" property evaluation and then another typically larger environment is used for the "attractive trace generation." The size of the environment is determined by the number of state variables needed to express the environment. Nevertheless, the arrival at such a good set of environments or traces often requires a very sophisticated trial and error refinement process which unnecessarily delays the generation of a good trace and adds undesirable manual and computational complexity. The use of multiple distinct environments is time-consuming because in many cases it requires superfluous full-blown model checking runs in which the model checker must be run again for each modification of the environment and/or property.

Under the current art, the complexity and sophistication required to perform formal verification often requires dedicated verification engineers, and much back-and-forth interaction as necessary between the verification engineer and the designer to obtain desired traces, and to fully enumerate necessary assumptions.

Therefore, there is a need for an extensible tool set and efficient underlying algorithm for achieving the goal of extracting a "good trace" more efficiently with less computational and manual complexity. The user should be able to extract much information very quickly from the tool rather than obtaining an arbitrary trace which may or may not be very desirable. The user should be able to pose questions in a very simple manner and extract traces from the verification tool without extensive trial and error refinement of the trace.

The user should also be able to use the model checker without having an understanding of the underlying algorithm or methods used by the tool. The method should allow the user to do additional tests on the model in an intuitive manner without having to conduct a full-blown model checking run for each modification.

A tool is needed to allow the verification engineer to more efficiently extract necessary assumptions, and to allow the designer to use the traces that were generated by the verification engineer to pose straightforward queries to further the design effort without further intervention by the verification engineer.

SUMMARY OF THE INVENTION

The present invention solves the problems of the prior art by making the model checking tool less complex, more efficient, and more user friendly. A waveform based "input/output" graphical user interface (GUI) is used to allow the user to highlight specific values at specific cycles and to modify the waveform displayed.

The user may begin either from "scratch" or from an existing trace produced by the tool. The user makes any changes to the desired waveform that is displayed on the GUI. The resulting waveform represents the trace that the user wishes to extract from the model using the verification tool.

In addition, the present invention allows the user to perform boolean functions over certain signals. The arguments for the function can either be particular values or may relate to temporal constraints such that the time for a particular value is specified.

Once the desired waveform is completed and highlighted, queries using trace tailor are performed. Sufficient modifications of the environment and/or property are made based on the results obtained. To insure that the result obtained is merely an alternate trace of the same pass/fail that was originally obtained, the same model, environment, and property is passed to the model checker. The annotations that are input by the user are translated to "cycle-specific invariants" to force the tool to produce a trace that satisfies the desired annotated waveform and to insure a much faster and more efficient query.

After a trace is provided, the user determines whether or not the trace is satisfactory. If not, then the user may tailor the trace by adding additional constraints to the waveform using the graphic user interface. In the case that the verification tool cannot provide a trace which satisfies the constraints input by the user, the user may make an additional iteration in which he removes one or more of the constraints.

The model checker of the present invention is useful for efficiently enumerating all assumptions necessary for satisfaction of a particular property. In obtaining rigorous proofs, the model checker generates an initial trace, a series of efficient queries using the trace tailor, a sufficient modification of environments and/or properties based on the necessary assumptions obtained from the trace tailor, and a new unrestricted call to the model checker to insure that no failures occur at a particular cycle. The model checker is also useful in conjunction with a rigorous proof approach, not just to enumerate assumptions, but also to merely tailor the traces to make them more succinct, e.g., to more clearly illustrate an error to a designer.

Finally, the trace tailor method may be used in and of itself to fabricate a trace from scratch. The iterative process with the trace tailor when creating the trace from scratch will still yield much information about the behavior of the model under test.

The foregoing techniques may be easily integrated into existing verification tools. The tool set also provides an intuitive and efficient platform for bridging model checking, directed search, and simulation reachability engines, thereby allowing users to obtain desired traces with minimal manual and computational complexity. This tool set helps bridge the gap between formal verification and the designer.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 2:
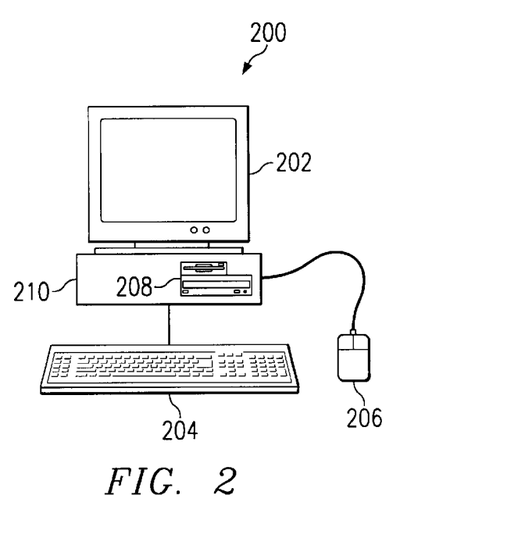
FIG. 2 is a pictorial representation depicting a data processing system which includes the present invention in accordance with a preferred embodiment of the present invention.

With reference now to the figures and in particular with reference to FIG. 2, a pictorial representation depicting a data processing system in which the present invention may be implemented in accordance with a preferred embodiment of the present invention is shown. A personal computer 200 is depicted which includes a system unit 210, a video display terminal 202, a keyboard 204, storage devices 208, which may include floppy drives and other types of permanent and removable storage media, and mouse 206. Additional input devices may be included with personal computer 200. Personal computer 200 can be implemented using any suitable computer, such as an IBM Aptiva™ computer, a product of International Business Machines Corporation, located in Armonk, N.Y. Computer 200 also preferably includes a graphical user interface that may be implemented by means of systems software residing in computer readable media in operation within computer 200. Although a particular processing system is shown, the methods of the present invention may be used on any processing system which executes instructions and has memory without departing from the scope and spirit of the invention.

Figure 3:
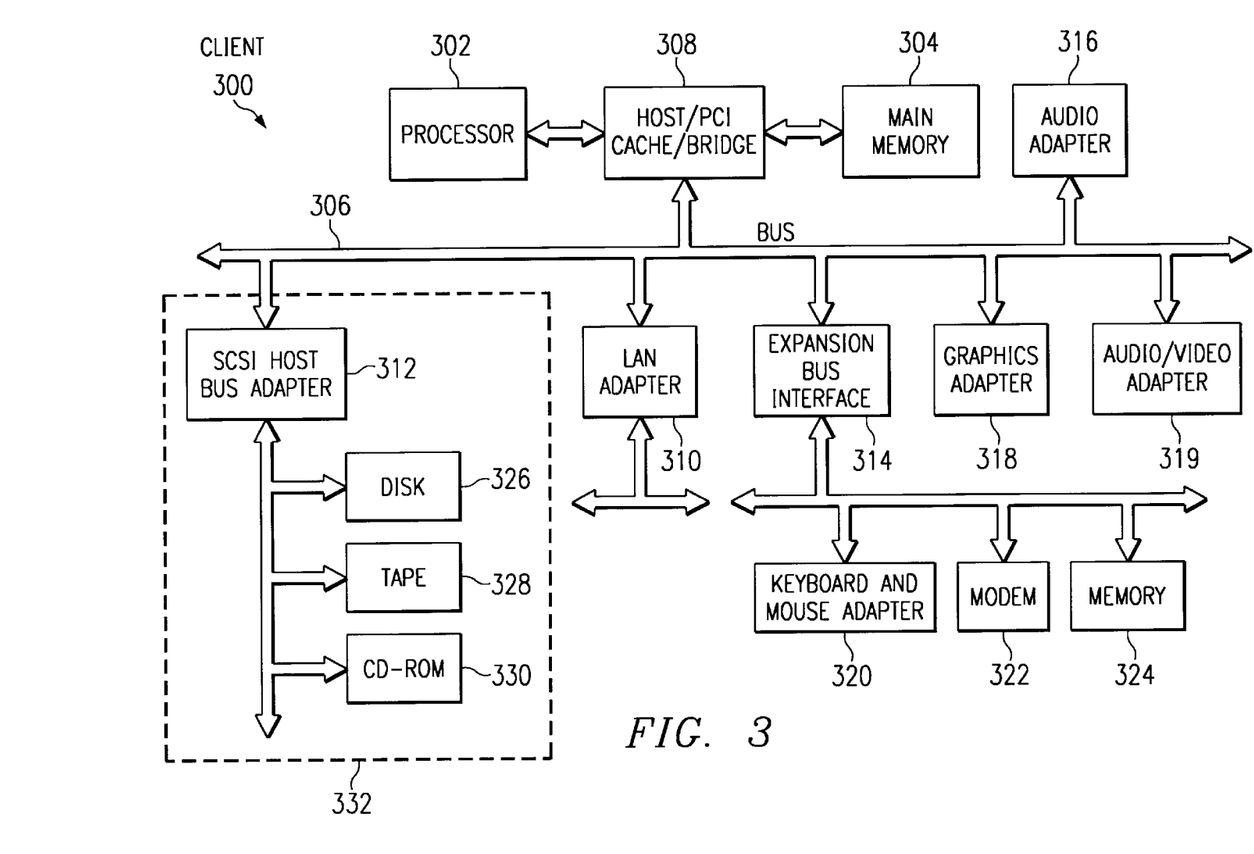
FIG. 3 is a block diagram illustrating a data processing system which includes the present invention in accordance with the present invention.

With reference now to FIG. 3, a block diagram illustrates a data processing system in which the present invention may be implemented. Data processing system 300 is an example of a computer, such as computer 200 in FIG. 2, in which code or instructions implementing the processes of the present invention may be located. Data processing system 300 employs a peripheral component interconnect (PCI) local bus architecture. Although the depicted example employs a PCI bus, other bus architectures such as Micro Channel and Industry Standard Architecture (ISA) may be used. Processor 302 and main memory 304 are connected to PCI local bus 306 through PCI bridge 308. PCI bridge 308 also may include an integrated memory controller and cache memory for processor 302. Additional connections to PCI local bus 306 may be made through direct component interconnection or through add-in boards. In the depicted example, local area network (LAN) adapter 310, small computer system interface SCSI host bus adapter 312, and expansion bus interface 314 are connected to PCI local bus 306 by direct component connection. In contrast, audio adapter 316, graphics adapter 318, and audio/video adapter 319 are connected to PCI local bus 306 by add-in boards inserted into expansion slots. Expansion bus interface 314 provides a connection for a keyboard and mouse adapter 320, modem 322, and additional memory 324. SCSI host bus adapter 312 provides a connection for hard disk drive 326, tape drive 328, and CD-ROM drive 330. Typical PCI local bus implementations will support three or four PCI expansion slots or add-in connectors.

An operating system runs on processor 302 and is used to coordinate and provide control of various components within data processing system 300 in FIG. 3. The operating system may be a commercially available operating system such as OS/2, which is available from International Business Machines Corporation. "OS/2" is a trademark of International Business Machines Corporation. An object oriented programming system such as Java may run in conjunction with the operating system and provides calls to the operating system from Java programs or applications executing on data processing system 300. "Java" is a trademark of Sun Microsystems, Inc. Instructions for the operating system, the object-oriented operating system, and applications or programs are located on storage devices, such as hard disk drive 326, and may be loaded into main memory 304 for execution by processor 302.

Those of ordinary skill in the art will appreciate that the hardware in FIG. 3 may vary depending on the implementation. Other internal hardware or peripheral devices, such as flash ROM (or equivalent nonvolatile memory) or optical disk drives and the like, may be used in addition to or in place of the hardware depicted in FIG. 3. Also, the processes of the present invention may be applied to a multiprocessor data processing system.

For example, data processing system 300, if optionally configured as a network computer, may not include SCSI host bus adapter 312, hard disk drive 326, tape drive 328, and CD-ROM 330, as noted by dotted line 332 in FIG. 3 denoting optional inclusion. In that case, the computer, to be properly called a client computer, must include some type of network communication interface, such as LAN adapter 310, modem 322, or the like. As another example, data processing system 300 may be a stand-alone system configured to be bootable without relying on some type of network communication interface, whether or not data processing system 300 comprises some type of network communication interface. As a further example, data processing system 300 may be a Personal Digital Assistant (PDA) device which is configured with ROM and/or flash ROM in order to provide non-volatile memory for storing operating system files and/or user-generated data.

The depicted example in FIG. 3 and above-described examples are not meant to imply architectural limitations. For example, data processing system 300 also may be a notebook computer or hand held computer in addition to taking the form of a PDA. Data processing system 300 also may be a kiosk or a Web appliance.

Figure 4:
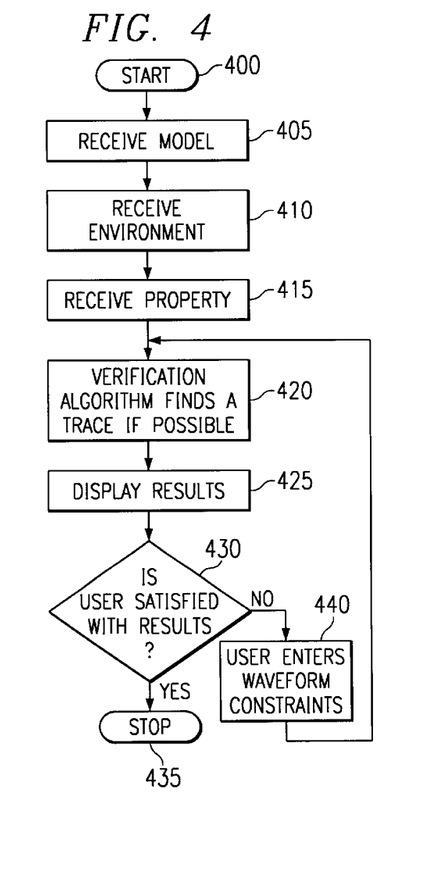
FIG. 4 is a flowchart of a preferred embodiment of the present invention.

Referring now to FIG. 4, a logical diagram of a preferred embodiment of the present invention is illustrated. Starting at block 400, a model of the design under test is received by the tool at block 405. An environment to which the model is to be subjected is received by the tool at block 410, and a property to be tested in this model is received by the tool at block 415. The model, environment, and the property are all input into a verification algorithm and the algorithm attempts to find a trace at block 420. Based on the results that are displayed at block 425, the user decides whether to proceed further with the model checking tool at block 430. The algorithm in block 420 may find a valid trace which would include a witness or a counter-example, or the algorithm may be unable to obtain a trace because of the constraints input by the user. If the user decides to continue further, the user at block 440 may either add additional waveform constraints using the graphical user interface or the user may take out some of the prior constraints if a trace was not previously found. The constraints entered by the user can relate to some variable a or to a boolean combination of a and b, or even temporal constraints may be entered by the user. The new set of constraints are added to the model, environment, and property that were previously input into the verification algorithm at block 420. Then the algorithm attempts to find a new trace at step 420 and the results are again displayed at step 425. This procedure is repeated until the user is satisfied with the result that is displayed at step 425.

In some cases, the resulting constrained waveform may not be producible given the environment and the property entered. For example, the constrained waveform may be unproducible because of the given environment description. Therefore, the user should select or highlight only the critical desired aspect of the resultant waveform. This will lessen the risk that the waveform will not be producible. The highlighting of particular aspects of the waveform is done on a per-signal, per-cycle basis. These highlighted values define the cycle-specific invariants passed to the verification algorithm.

Figure 5:
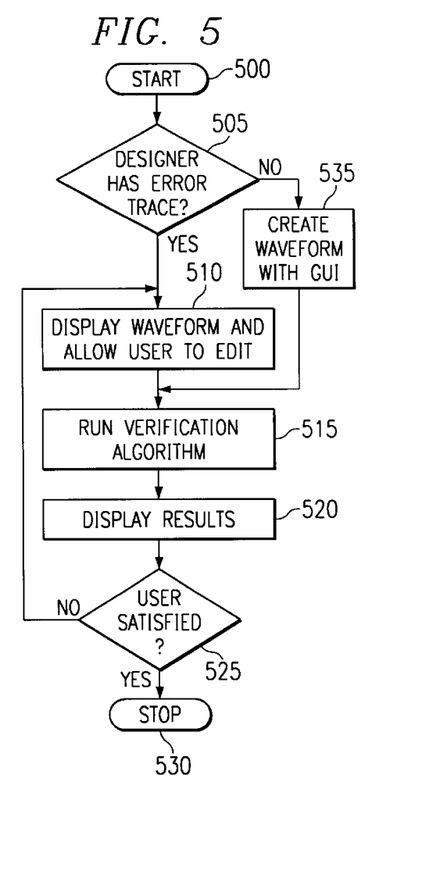
FIG. 5 is a flowchart illustrating two different methods of using the present invention.

Referring now to FIG. 5, an illustration of the two different methods of using the present invention is shown. The user begins the procedure from one of two starting points: either no trace has yet been created or an existing trace is available. If the designer already has an error trace available at block 505, then the designer simply edits the displayed waveform on the graphical user interface at step 510. After the waveform is displayed and edited, the verification algorithm is run at block 515. The results are displayed on the graphical user interface at block 520. The user determines at block 525 whether the trace is satisfactory. If the trace is not satisfactory, then the process loops back to block 510 where the designer again displays and edits the waveform. If the trace is desirable, then the model checking routine is ended at 530.

In the case where the designer starts with no error trace at block 500, the graphical user interface is used to create a waveform at block 535. Then the waveform created on graphical user interface at block 535 is input into the verification algorithm at block 515. Thereafter, the process is the same as if the designer already had an error trace at block 505.

Figures 6, 7, 8:
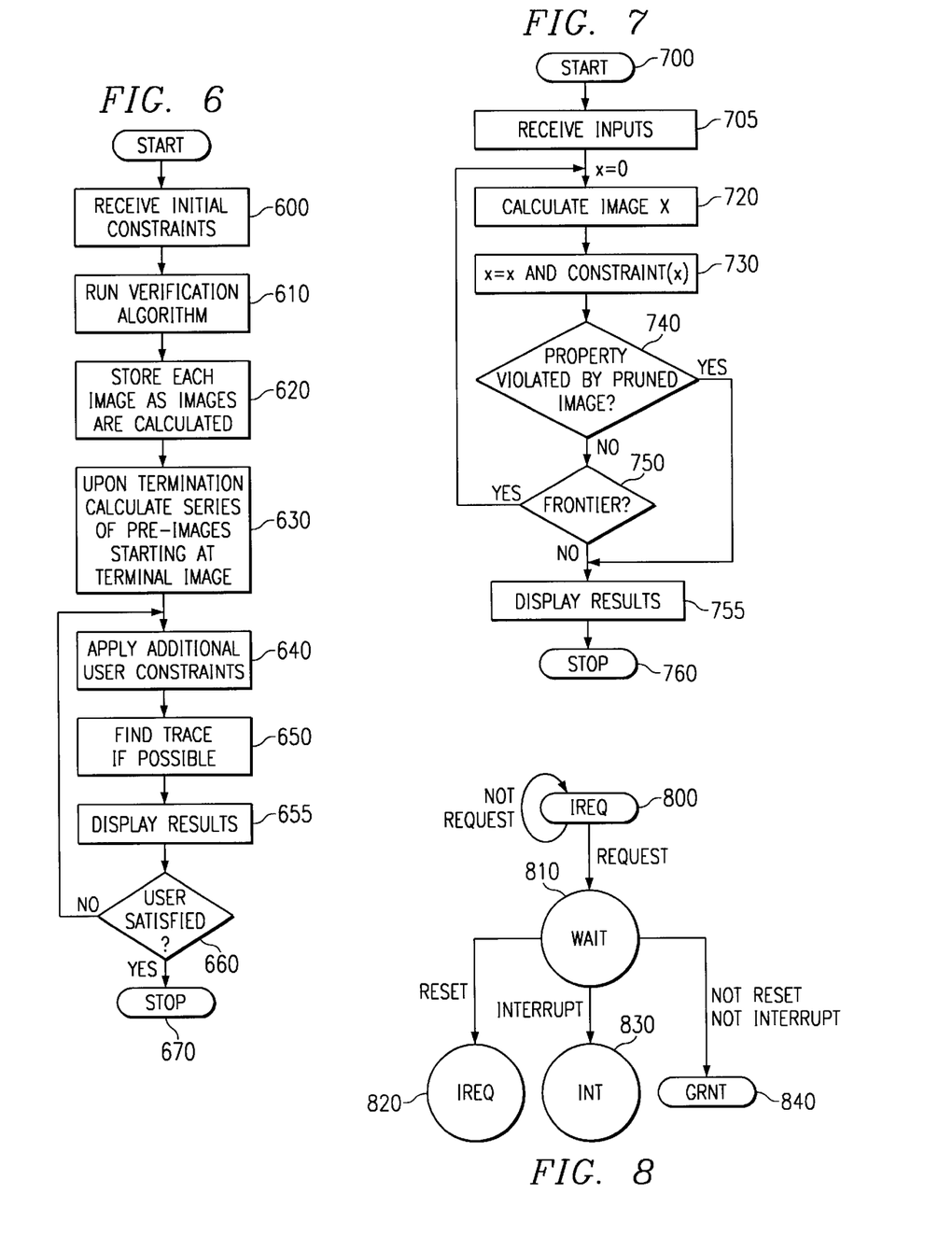
FIG. 6 is a flowchart of an alternative embodiment of the present invention for a design debug implementation.
FIG. 7 is a flowchart of an alternative embodiment of implementation of the present invention for branching time logic.
FIG. 8 is a state diagram of a particular use of the model checker in the branching time logic configuration.

Referring now to FIG. 6, an alternative embodiment of the present invention is illustrated. The tool can embrace a much faster though more memory consuming algorithm by running in a mode which retains all possible fails for very fast exploration. This is also referred to as the design debug implementation of the present invention. In the design debug implementation, the initial constraints including the model, environment, and a property are received at block 600. The verification algorithm calculates images at block 610 and retains each in memory at block 620. Upon termination, i.e., the terminal image is calculated, the tool calculates a series of pre-images at block 630 starting at the terminal image and pruning the set of previously calculated images with these pre-images. The terminal image could be the point at which a pass or failure is observed. The pre-image of a set of states X is a set of states Y which can reach set X in one time step. So, if the image of Y=X, then the pre-image of X=Y.

For example, if a failure was observed at cycle 10, the $0^{th}$ through $10^{th}$ image is saved in memory. Thus, at the end of the failure, the $10^{th}$ image is pruned to show its components which represent a failure. For example, if the property is that P must always hold, then the failure must show that some states in cycle 10 exhibit that P is false. Thus, these are the components that represent the failure. The set of states which may reach this pruned $10^{th}$ image in one cycle, called the pre-image of the pruned $10^{th}$ state, is calculated. The intersection of the $9^{th}$ image with this pre-image is performed and the intersection replaces the $9^{th}$ image, i.e., the $9^{th}$ image is pruned. This process iteratively continues until all images, including the $0^{th}$ image, are pruned.

After the pruning is accomplished, the pruned set is such that any element of the set is a component of a valid trace illustrating the witness or counter-example that satisfies all of the initial specified constraints. The user may then add yet another constraint at block 640 and with a single calculation the tool determines at block 650 whether the given trace is satisfiable given this additional constraint. If so, a single path is efficiently selected from the pruned image set. If the user is satisfied with the results displayed at block 655, then the process is complete at block 670. However, if the user is not satisfied, then additional user constraints may be applied by the user at block 640. The user continues in this manner until a satisfactory trace is displayed at block 655.

If the user adds a series of constraints spanning M cycles, the tool can very quickly determine if the given trace is satisfiable given these additional constraints. It will take no more than M single-step image and pre-image calculations to make this determination. If N is the length of the original trace, then the tool can finish extracting the trace in N–M single-step image and pre-image calculations. The simplicity of these calculations is due to the fact that after application of the constraints, a single state may be chosen from the set representing a single cycle. An image or pre-image calculation of a single state is in general relatively small resulting in a simpler computation. This image or pre-image calculation is intersected with the pruned image set and then another single state can be chosen arbitrarily from the intersection for the next step. Furthermore, the images that are calculated using this process may be saved to disk for later retrieval and reasoning.

Although such an implementation of the present invention is memory consuming, if model checking a given property is feasible given its CPU/memory requirements, then saving every image to memory for fast trace generation is probably also feasible. However, one skilled in the art would recognize that in order to offset a possible factor of N blow up in memory consumption, binary decision diagram (BDD) reduction techniques such as retaining only "delta information" on a per-cycle basis may be used. A BDD is a data structure for representing a boolean function. For example, retaining only delta BDD's whereby one BDD indicates the states in the $N^{th}$ image which are not present in the $(N-1)^{th}$ image, and one indicating the missing state from the $(N-1)^{th}$ image rather than retaining every full BDD.

Referring now to FIG. 7, an implementation of the present invention for branching time logic is illustrated. This embodiment of the invention uses "cycle specific invariants" of the format "cycle x→invar p." This means that if the tool is calculating the $x^{th}$ image, then apply invar p, otherwise ignore this invariant. For example, if the user highlights the following in a waveform: 1) x=cycle 1, REQ=1; 2) x=cycle 2, GNT=0; 3) x=cycle 3, GNT=1. Then the tool will generate the following: cycle 1→invar REQ=1; cycle 2→invar GNT=0; cycle 3→invar GNT=1. The use of invariants in this manner forces the enhanced model checker to consider only paths where the desired constraints hold and where the witness/counter-example contains the desired property. This greatly simplifies the state space search because far fewer paths are encountered than the original search in which no invariants are specified.

In FIG. 7, the inputs which represent the environment, model, property, and constraints entered by the user are received by the model checker at block 705. The model checker then constructs a representation of the waveform constraints for each time step. These are called "constraint (x)," referring to the constraints at time x. On the first pass x is initialized to 0 and image x is calculated at block 720, which on the first pass would be image 0. After this image is calculated, the model checker prunes the image at step 730 according to the corresponding constraint. If the pruned image violates the property at block 740, then the results are displayed at block 755 and the process is finished at block 760. If the pruned image calculation does not violate the property, then the tool checks to see if there are any new states after this pruning at block 740, also referred to as the "frontier." If there are no new states, the work is done and the tool reports that "no trace is possible" at block 755. However, if new states are found to exist from the pruned image, then the process is repeated starting at block 720. Thus, at block 720, image 1 is calculated which is also the frontier of image 0. Only pass/fail information and any witness or counterxample are displayed to the user at block 755. The internal data such as the images are invisible to the user.

With reference now to FIG. 8, a finite state machine diagram of a particular use of the model checker in the branching time logic configuration is illustrated. Time 0 represents the state IREQ 800. (The loop back to IREQ 800 is just a shorthand notation indicating that if "Not Request" is input, then the entire tree is replicated along that path. Each arc traversed increments the "time stamp" by 1 along the current path). Each branch out of a state represents different "next states." From IREQ 800, if Request is input, the machine moves to state Wait 810. From Wait 810, there are 3 possible next states: IREQ 820, INT 830, and GRNT 840. If a "Reset" is input at state Wait 810, the next state is IREQ 820. If an "Interrupt" is input at state 810, then the next state is INT 830. If neither "Reset" nor "Interrupt" are input at state Wait 810, then the next state is GRNT 840.

Applying this state diagram to the model checker of the present invention, the designer enters the property: "if Request is asserted, then a GNT will exist within 2 cycles." After running the model checker, the designer may obtain a trace with the following (state, input) pairs: (IREQ, Request), (Wait, Reset), (IREQ, *) *denoting "don't care." The tool notes a fail of the property because the input (Reset) at time 1 (where time 0 is the initial state), causes the next state to be IREQ, which violates the property. The designer is unhappy with this trace because a Reset should lead back to state IREQ 820. Hence, the designer uses the trace tailor to enter the constraint: "at time 1, Reset=0." The designer reruns the model checker with this additional constraint. The designer then gets a failure of the property with the following trace: (IREQ, Request), (Wait, Interrupt), (INT, *) This may represent a bug in the design. If so, then the verification effort is a success. If not, then this too is an unacceptable trace. So, the designer adds a second constraint that Interrupt=0 at time 1. Rerunning the model checker yields a pass because there is no state within two cycles after Request where there is no grant given.

In the present invention, the user may also quickly add cycles to the end of a trace. For example, the user may specify to add two cycles. The tool then loads the design environment, injects the last state represented in the present trace into the design environment, and randomly selects a sequence of two legal input vectors and quickly performs a two-step simulation. Such a simulation is low order polynomial in complexity and therefore would be much faster than image calculations which are exponential in complexity.

The user may also wish to constrain these additional cycles to some particular condition. Although placing additional conditions or constraints on these additional cycles will result in exponential complexity (due to a breadth first search), only the two additional cycles need to be calculated, rather than the whole trace that was calculated initially. Because these two cycles may begin from a single injected state, the complexity is generally manageable for two reasons. First, the image of a single state will tend to be small, and second, after the first image is calculated and intersected with its constraints, a single representative state from this intersection may be used as the basis for the second image calculation. When used in this fashion, the tool is a powerful and easy-to-use combination of model checking and a simulation algorithm, focused upon providing the user with a desired trace as efficiently as possible. This allows much information to be extracted from the model under test, which would not have been possible with traditional tools without much additional CPU time, user experience, and manual intervention.

As discussed previously, current state-of-the-art requires creation of a cycle-counting automaton to apply cycle-specific invariants to guide the state space search. This is undesirable because the model checking run is in general exponential in the size of the model plus this automaton. A preferred embodiment of this invention explicitly utilizes the fact that the model checker implicitly knows what cycle is calculated. In other words, the model checker generates the initial state set, it is known that time=0. When the set of states reachable from the initial set is calculated, it is known that time=1. Thus, the above scheme may be best implemented by a slightly customized model checker which utilizes its implicit knowledge of which cycle it is working on, rather than forcing the user to create a counter automaton which adds to the complexity of the run. In the present invention, the complexity is exponential in model size alone. However, recall that in the prior art the complexity is exponential in size of model plus the size of the automaton. In the present invention, the use of invariants does insure lesser complexity of the run. Thus, using implicit knowledge of the current cycle results in less complexity of the run when using constraints unlike the prior art where the use of constraints actually added to the complexity of the run. In the present invention, the complexity is exponential in model size alone. However, recall that in the prior art the complexity is exponential in size of model plus the size of the automaton. In the present invention, the use of invariants does insure lesser complexity of the run. Thus, using implicit knowledge of the current cycle results in less complexity of the run when using constraints unlike the prior art where the use of constraints actually added to the complexity of the run.

It is important to note that while the present invention has been described in the context of a fully functioning data processing system, those of ordinary skill in the art will appreciate that the methods of the present invention are capable of being distributed in the form of a computer readable medium of instructions with any variety of forms. The present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. Accordingly, the present invention is not intended to be limited to the specific form set forth herein, but is intended to cover such alternatives and modifications as can reasonably be included within the spirit and scope of the invention.

What is claimed is:

1. A method for formal verification of a design in a data processing system comprising:
    receiving initial constraints;
    running a verification algorithm using the initial constraints;
    storing at least one image including first states;
    pruning said at least one image to produce a pruned image by removing second states from said at least one image leaving only third states in said pruned image,
    calculating at least one pre-image that includes fourth states that can reach said pruned image in one cycle;
    applying an additional constraint on a waveform; and
    finding a trace using the additional constraint, wherein the additional constraint is applied to the at least one pre-image.

2. The method of claim 1 further comprising:
    creating the waveform using a graphical user interface.

3. The method of claim 1 further comprising:
    removing a prior constraint from the waveform.

4. The method of claim 1 further comprising:
    editing the waveform using a graphical user interface.

5. The method of claim 1 wherein the step of receiving initial constraints comprises the steps:
    receiving a model;
    receiving an environment;
    receiving a property to be verified; and
    receiving a waveform constraint,
    wherein the model, the environment, the property, and the waveform constraint are used in the verification algorithm to find the at least one image, the at least one pre-image, and the trace.

6. The method of claim 1 wherein the at least one pre-image is calculated beginning with a terminal image.

7. The method of claim 6 wherein the at least one pre-image is stored for later retrieval.

8. The method of claim 5 wherein the waveform constraint comprises a limitation on a variable.

9. The method of claim 8 wherein the waveform constraint comprises a limitation on a variable for a specific time period.

10. The method of claim 8 wherein the waveform constraint comprises a boolean limitation operating on a plurality of variables.

11. The method of claim 1 wherein the step of applying additional constraints comprises translating a graphically entered constraint into a cycle specific invariant.

12. An apparatus for performing formal verification of a design in a data processing system comprising:
    a means for receiving initial constraints;
    a means for running a verification algorithm using the initial constraints;
    a means for storing at least one image including first states;
    a means for pruning said at least one image to produce a pruned image by removing second states from said at least one image leaving only third states in said pruned image;
    a means for calculating at least one pre-image that includes fourth states that can reach said pruned image in one cycle;
    a means for applying an additional constraint on a waveform; and
    finding a trace using the additional constraint, wherein the additional constraint is applied to the at least one pre-image.

13. The apparatus of claim 12 further comprising:
    a means for creating the waveform using a graphical user interface.

14. The apparatus of claim 12 further comprising:
    a means for removing a prior constraint from the waveform.

15. The apparatus of claim 12 further comprising:
    a means for editing the waveform using a graphical user interface.

16. The apparatus of claim 12 wherein the means for receiving initial constraints comprises the steps:
    a means for receiving a model;
    a means for receiving an environment;
    a means for receiving a property to be verified; and
    a means for receiving a waveform constraint,
    wherein the model, the environment, the property, and the waveform constraint are used in the verification algorithm to find the at least one image, the at least one pre-image, and the trace.

17. The apparatus of claim 12 further comprising:
    a means for calculating the at least one pre-image beginning with a terminal image.

18. The apparatus of claim 12 further comprising:
    a means for storing the at least on pre-image for later retrieval.

19. The apparatus of claim 12 wherein the means for applying additional constraints comprises a means for translating a graphically entered constraint into a cycle specific invariant.

20. A computer program product in a computer readable medium containing instructions which when executed on a computer cause the computer to perform formal verification of a design in a data processing system, the computer program product comprising:
    instructions for receiving initial constraints;
    instructions for running a verification algorithm using the initial constraints;

instructions for storing at least one image including first states;

instructions for pruning said at least one image to produce a pruned image by removing second states from said at least one image leaving only third states in said pruned image;

instructions for calculating at least one pre-image that includes fourth states that can reach said pruned image in one cycle;

instructions for applying an additional constraint on a waveform; and instructions for finding a trace using the additional constraint, wherein the additional constraint is applied to the at least one pre-image.

21. The product of claim 20 further comprising:

instructions for creating the waveform using a graphical user interface.

22. The product of claim 20 further comprising:

instructions for removing a prior constraint from the waveform.

23. The product of claim 20 further comprising:

instructions for editing the waveform using a graphical user interface.

24. The product of claim 20 wherein the instructions for receiving initial constraints comprises:

instructions for receiving a model;

instructions for receiving an environment;

instructions for receiving a property to be verified; and instructions for receiving a waveform constraint, wherein the model, the environment, the property, and the waveform constraint are used in the verification algorithm to find the at least one image, the at least one pre-image, and the trace.

25. The product of claim 20 further comprising:

instructions for calculating the at least one pre-image beginning with a terminal image.

26. The product of claim 20 further comprising:

instructions for storing the at least on pre-image for later retrieval.

27. The product of claim 20 wherein the instructions for applying additional constraints comprises instructions for translating a graphically entered constraint into a cycle specific invariant.

* * * * *